United States Patent [19] [11] Patent Number: 5,953,642
Feldtkeller et al. [45] Date of Patent: Sep. 14, 1999

[54] SYSTEM FOR CONTACTLESS POWER AND DATA TRANSMISSION

[75] Inventors: Martin Feldtkeller; Reinhard Greiderer; Kurt Marquardt; Jürgen Nolles, all of München; Robert Reiner, Unterhaching, all of Germany

[73] Assignee: Siemens Aktiengesellschaft, Munich, Germany

[21] Appl. No.: 08/847,866

[22] Filed: Apr. 28, 1997

Related U.S. Application Data

[63] Continuation of application No. PCT/DE95/01491, Oct. 26, 1995.

[30] Foreign Application Priority Data

Oct. 26, 1994 [DE] Germany ............................. 44 38 287

[51] Int. Cl.$^6$ ..................................................... H04B 1/16
[52] U.S. Cl. .................................. 455/195.1; 455/193.1; 455/290; 334/55
[58] Field of Search ............................. 455/150.1, 151.2, 455/191.1, 193.2, 195.1, 290, 193.1; 340/825.34, 825.54; 334/55

[56] References Cited

U.S. PATENT DOCUMENTS 4,339,827  7/1982  Torres et al. ......................... 455/193.1
4,794,650  12/1988  Yokoyama ............................ 455/195.1

FOREIGN PATENT DOCUMENTS

93/23908  11/1993  WIPO .

*Primary Examiner*—Reinhard J. Eisenzopf
*Assistant Examiner*—Sam Bhattacharya
*Attorney, Agent, or Firm*—Herbert L. Lerner; Laurence A. Greenberg

[57] ABSTRACT

In a system for contactless power and data transmission, a transmitting or receiving station has at least one transmitting or receiving resonant circuit which is driven by an integrable control circuit. The integrated control circuit has a multiplicity of capacitors which can be switched in, in parallel with the resonant circuit. A device is provided for driving the switching device.

6 Claims, 1 Drawing Sheet

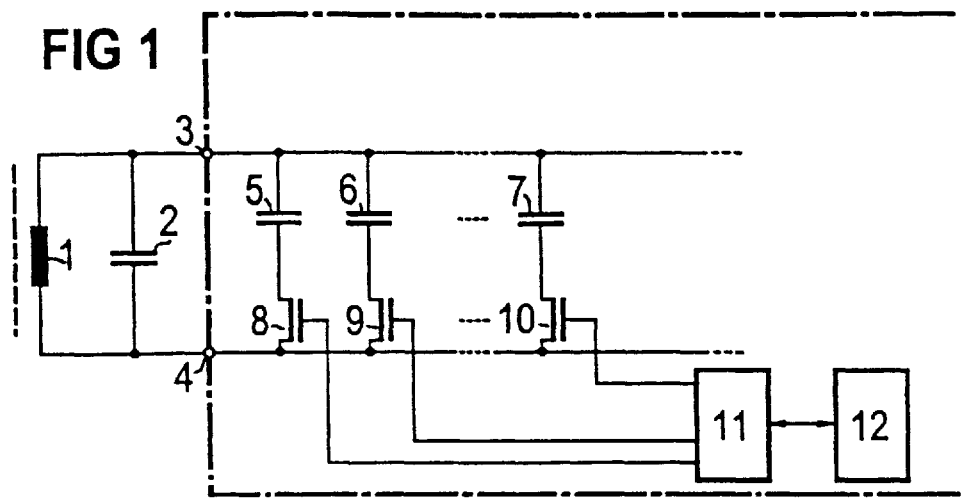
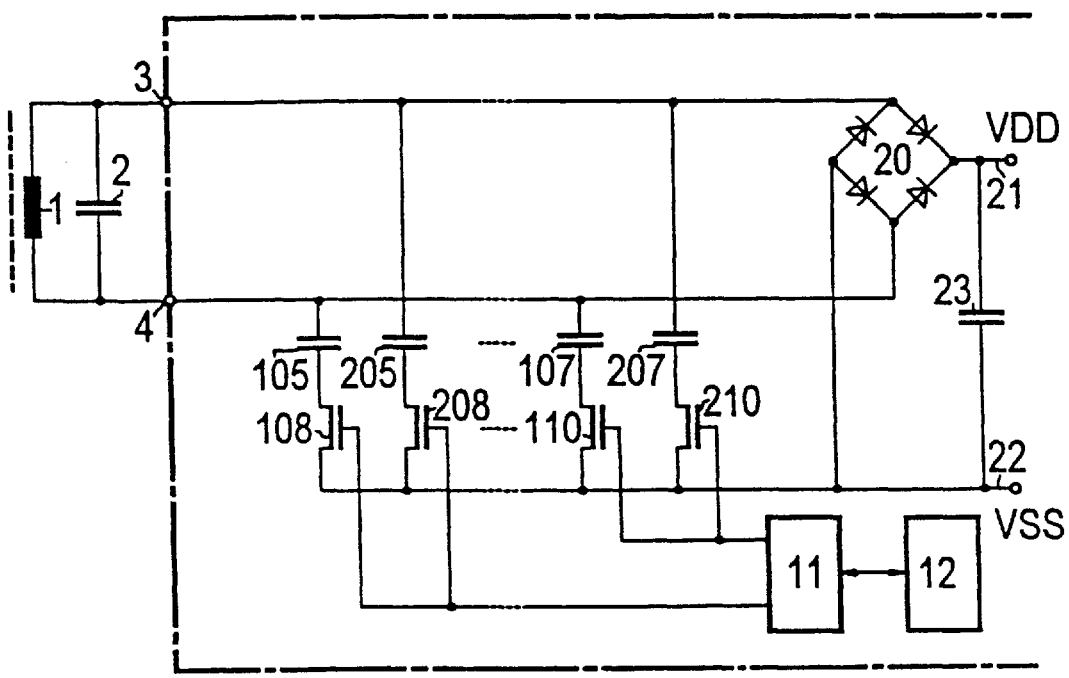

SYSTEM FOR CONTACTLESS POWER AND DATA TRANSMISSION

CROSS REFERENCE TO RELATED APPLICATION

This application is a continuation of application Ser. No. PCT/DE95/01491, filed Oct. 26, 1995.

BACKGROUND OF THE INVENTION

Field of the Invention

The invention relates to a system for contactless power and data transmission between a mobile station and a stationary station, in which the mobile station has a tunable resonant circuit that is driven by a control circuit, the control circuit has a multiplicity of capacitors which can be switched in in parallel with the resonant circuit by a switching device, and a device is provided for driving the switching device.

Such systems generally include a stationary station and a mobile part, for example in the form of a smart card or a chip key, etc.. In that case the stationary station provides the power for the mobile part. A loosely coupled coil pair, wherein each coil is assigned to a resonant circuit in the mobile part and the stationary part, is generally provided for that purpose. The power transmission is effected in that case by a radio-frequency signal which is fed to a rectifier nit and a downstream regulating unit in the mobile part.

In the case of such systems with contactless power transmission, the efficiency is highest when the transmission frequency of the primary circuit corresponds to the resonant frequency of the secondary circuit. For example, the primary circuit in that case constitutes the resonant circuit of the stationary part, and the secondary circuit that of the mobile part. Due to component fluctuations, that requirement can only be achieved within the sum of component tolerances. The technical requirements of power loss, quality of the components, coupling factor of primary and secondary circuits, etc., necessitate tuning of the secondary circuit.

German Patent DE 38 10 702 C2 specifies a device for contactless power and data transmission in which the stationary station contains a tunable resonant circuit. The latter is driven by a control circuit in order to carry out tuning to a resonant circuit in the mobile part, thereby achieving the best possible reception. For the purpose of tuning, variable-capacitance diodes are connected in parallel with the resonant circuit of the stationary part and are controlled by a value-continuous control voltage derived from a regulating circuit. The variable-capacitance diodes are readjusted by altering the control voltage, thereby counteracting detuning of the circuit.

SUMMARY OF THE INVENTION

It is accordingly an object of the invention to provide a system for contactless power and data transmission, which overcomes the hereinafore-mentioned disadvantages of the heretofore-known devices of this general type, which satisfies the above-mentioned requirements in a simple manner and in which a tunable resonant circuit is present in a mobile station.

With the foregoing and other objects in view there is provided, in accordance with the invention, in a system for contactless power and data transmission between a mobile station and a stationary station, the mobile station comprising a tunable resonant circuit; a control circuit driving the resonant circuit, the control circuit having a multiplicity of capacitors each including a first and a second partial capacitor, connection nodes each connected between the first and second partial capacitors of a respective one of the capacitors, and at least one switching device for connecting the partial capacitors to one another and switching in the capacitors in parallel with the resonant circuit; a device for driving the switching device; and a terminal for a reference potential to be connected to the connection nodes.

The present invention has the advantage of permitting the resonant frequency to be tuned in a simple manner as a result of the provision of capacitors which can be switched in, in addition to the capacitor of the resonant circuit in the primary or secondary circuit. The tuning can be effected manually or automatically.

In accordance with another feature of the invention, automatic tuning can be effected starting from a mean value of the resonant frequency and optimum tuning can be effected by switching the capacitors in or out.

In accordance with a further feature of the invention, a value determined in this way can be stored in a nonvolatile memory of the mobile part and is thus immediately available for each new coupling.

In accordance with an added feature of the invention, the resonant circuit has a first terminal connected to the first partial capacitors and a second terminal connected to the second partial capacitors, the at least one switching device connects the first and second partial capacitors to the terminal for the reference or supply potential, and the at least one switching device can be driven with the same biasing.

In accordance with a concomitant feature of the invention, the supply potential is obtained from a voltage to be picked off at the terminals of the resonant circuit by rectification and smoothing.

Other features which are considered as characteristic for the invention are set forth in the appended claims.

Although the invention is illustrated and described herein as embodied in a system for contactless power and data transmission, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of a first embodiment of a receiving part of a system according to the invention; and FIG. 2 is a circuit diagram of a second embodiment of the receiving part.

DESCRIPTION OF THE PREFERRED EMBODIMENTS

Referring now to the figures of the drawings in detail and first, particularly, to FIG. 1 thereof, there is seen an exemplary embodiment in which reference numeral 1 represents a transmission coil and reference numeral 2 represents a capacitor that is connected in parallel with the coil and forms a resonant circuit together with the transmission coil. Terminals of the resonant circuit lead to contacts 3, 4 of an integrated circuit. The integrated circuit contains nonillustrated, respectively required, power transmission and data transmission circuits as well as downstream evaluation units. Only a matching circuit for tuning a resonant frequency of the resonant circuit is indicated in the illustrated example of FIG. 1. Thus, reference numerals 5, 6 and 7 represent three of n capacitors, for example, which can be connected in parallel within a control circuit indicated by dash-dot lines for driving the resonant circuit. On one hand, these capacitors are each connected to the terminal contact 3 and on the other hand they are each connected through a load path of a respectively associated switching transistor 8, 9, 10 to the switching contact 4. Control terminals of the switching transistors 8, 9, 10 are each connected to control outputs of a drive unit 11. The drive unit 11 is coupled to a nonvolatile memory 12.

The additional connectable capacitors 5, 6, 7 serve, for example, to tune a secondary resonant circuit of a mobile part. The capacitors 5, 6, 7 are rated in such a way that it is possible to compensate for tolerances of the external components 1, 2. The tuning is effected, for example, in such a way that the capacitors 5, 6, 7 can be switched in or out in parallel with the external resonant circuit 1, 2. For this purpose, some of the capacitors 5, 6, 7 are already switched in prior to the tuning operation, that is to say during a so-called power-on phase of the integrated circuit. With the tuning operation, the capacitors are either switched out or supplemented by additional capacitors. A value of the capacitors which is necessary for tuning the resonant circuit is stored, for example, in the nonvolatile memory 12 which may be an EEPROM and is called up during the starting operation of the integrated circuit for the purpose of tuning the specific external circuitry.

A tunable tolerance range and the resonant frequency are centered by the capacitors which are switched in prior to tuning. As a result, the starting behavior is improved and, due to the preliminary tuning, larger tolerances become permissible and the tuning range is extended both to the negative and to the positive tolerance range.

In this case, the control unit 11 may be configured in such a way that it is driven, for example, through the use of a microprocessor, which is generally already present on the integrated circuit, during the power-on phase, in such a way that the system is tuned automatically. For this purpose, it is necessary to merely provide an analog-digital interface which communicates to the processor when the optimum resonant frequency is set. Such a signal which can be fed to the analog-digital converter is simple to derive, generally from the voltage supply of the mobile part.

The tuning could also equally be effected in the stationary part and would then have to be carried out separately for each mobile part in each case before the start-up of the data transmission with the mobile part. Such a configuration would have the advantage of causing the integrated circuits of the mobile parts to take up less chip area.

In an exemplary embodiment of a mobile part which is shown in FIG. 2, the capacitors for tuning which are connected in parallel with the resonant circuit 1, 2 each include a first and a second partial capacitor, which can be connected to one another through a switching element and consequently can be connected in parallel with the resonant circuit 1, 2. In detail, one terminal of a first partial capacitor 105 is connected to the terminal 4 of the resonant circuit 1, 2 and one terminal of a second partial capacitor 205 is connected to the terminal 3 of the resonant circuit 1,2. Other terminals of the partial capacitors 105, 205 are each connected through a respective switching transistor 108, 208 to a terminal 22 for a supply potential VSS. Accordingly, a connection node between the partial capacitors 105, 205 is connected to the terminal 22. Control terminals of the transistors 108, 208 are connected to one another and are driven by the drive unit 11 for the purpose of tuning the resonant circuit 1, 2 to the resonant frequency in the manner described above. Further partial capacitor pairs are provided in a corresponding manner, for example first and second partial capacitors 107 and 207 with respectively assigned switching transistors 110 and 210. Accordingly, a connection node between the partial capacitors 107, 207 is connected to the terminal 22.

The supply potential VSS is a negative pole of a rectified and smoothed supply voltage picked off from the parallel resonant circuit at the terminals 3, 4. The integrated control circuit is supplied with voltage through the use of this voltage. To this end, a bridge rectifier 20 is connected on an input side to the terminals 3, 4. A smoothing capacitor 23 is connected to an output side of the bridge rectifier 20. The negative supply potential VSS is present at the terminal 22 which is one terminal of the smoothing capacitor 23 and a positive supply potential VDD is present at another terminal 21 of the smoothing capacitor.

In the embodiment shown in FIG. 1, the switching transistors 8, 9, 10 which are provided as a switching device act as transfer transistors. A positive gate-source voltage is necessary to activate the transistors. Since the potential at the terminal 4 is not fixed at a reference point, it may happen that the respective switching transistor cannot be switched on reliably or cannot be switched off reliably. On one hand, in order to be able to ensure correct switching on or off of the transistors, the circuit requires a relatively high supply voltage. On the other hand, this means that the requirements on the tolerance range of the supply voltage are elevated. The supply voltage must therefore be provided in such a way that it is as high as possible and as stable as possible.

In contrast thereto, unlike the case of FIG. 1, the respective switching transistor in the exemplary embodiment of FIG. 2 is not connected in a floating manner into the connection path between the terminals 3, 4 of the parallel resonant circuit, but rather is connected to the reference potential VSS. If, for example, the transistors 108, 208 are switched on, the partial capacitor 105 becomes active between the terminal 4 and the reference potential VSS, and the partial capacitor 205 becomes active between the terminal 3 and the reference potential VSS. In this case, the partial capacitors 105, 205 become active as a series circuit between the terminals 3, 4 of the resonant circuit 1, 2. For these reasons, the circuit operates even at a relatively low supply voltage. A higher fluctuation range for the supply voltage is correspondingly permissible.

We claim:

1. In a system for contactless power and data transmission between a mobile station and a stationary station, the mobile station comprising:

a tunable resonant circuit;

a control circuit driving said resonant circuit, said control circuit having a multiplicity of capacitive circuits including a first capacitor, a second capacitor, a connection node, and at least one switching device; said at least one switching device in a given switching state connecting said first capacitor and said second capacitor in series and connecting said resonant circuit in parallel with said series-connected first and second capacitors, and said at least one switching device in said given switching state connecting said connection node between said first capacitor and said second capacitor;

a device for driving said switching device; and a terminal for a reference potential to be connected to said connection node.

2. The system according to claim 1, wherein said device for driving said switching device tunes said resonant circuit starting from a mean value, during start-up of the system, by causing said switching device to enter into said given switching state or to exit from said given switching state.

3. The system according to claim 2, including a nonvolatile memory device for storing determined values for tuning said resonant circuit.

4. The system according to claim 1, wherein said resonant circuit has a first terminal connected to said first capacitor and a second terminal connected to said second capacitor, said at least one switching device connects said first capacitor and said second capacitor to said terminal for the reference potential, and said at least one switching device can be driven with the same biasing.

5. The system according to claim 4, wherein the reference potential is a supply potential.

6. The system according to claim 5, wherein the supply potential is obtained from a voltage to be picked off at said terminals of said resonant circuit by rectification and smoothing.

* * * * *